(12) United States Patent
Nagase et al.

(10) Patent No.: US 12,424,468 B2
(45) Date of Patent: Sep. 23, 2025

(54) CONCENTRATION MEASUREMENT DEVICE

(71) Applicant: FUJIKIN INCORPORATED, Osaka (JP)

(72) Inventors: Masaaki Nagase, Osaka (JP); Keiichi Hasegawa, Osaka (JP); Kouji Nishino, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 831 days.

(21) Appl. No.: 17/442,529

(22) PCT Filed: Mar. 18, 2020

(86) PCT No.: PCT/JP2020/011902
§ 371 (c)(1),
(2) Date: Sep. 23, 2021

(87) PCT Pub. No.: WO2020/203281
PCT Pub. Date: Oct. 8, 2020

(65) Prior Publication Data
US 2022/0172969 A1    Jun. 2, 2022

(30) Foreign Application Priority Data
Mar. 29, 2019 (JP) ................. 2019-065571

(51) Int. Cl.
*H01L 21/67* (2006.01)
*G01N 21/33* (2006.01)
*G01N 21/3504* (2014.01)

(52) U.S. Cl.
CPC ....... *H01L 21/67253* (2013.01); *G01N 21/33* (2013.01); *G01N 21/3504* (2013.01)

(58) Field of Classification Search
CPC ....... G01N 21/3504; G01N 2021/0389; G01N 21/05; G01N 21/33; G01N 2021/0314;
(Continued)

(56) References Cited

U.S. PATENT DOCUMENTS

2012/0330568 A1* 12/2012 Izawa ................ G01N 21/3504
250/226
2013/0210682 A1* 8/2013 Eltoukhy ............. C12Q 1/6874
506/38
(Continued)

FOREIGN PATENT DOCUMENTS

EP      3176564 A1    6/2017
JP      H05-132393 A  5/1993
(Continued)

OTHER PUBLICATIONS

International Search Report issued in PCT/JP2020/011902; mailed Jun. 9, 2020.

*Primary Examiner* — Tarifur R Chowdhury
*Assistant Examiner* — Amanda Merlino
(74) *Attorney, Agent, or Firm* — Studebaker & Brackett PC

(57) ABSTRACT

A concentration measurement device 20 for measuring the concentration of the a gas flowing through a junction block 14 connected to a plurality of gas supply lines includes a light source 40 for generating light incident to a flow path formed in the junction block, a photodetector 44 for receiving light emitting from the flow path, and an arithmetic control circuit 46 for determining the concentration of the gas flowing through the flow path based on the output of the photodetector, translucent incident windows 26 and 23 for making light from the light source incident to the flow path and, at least one of the translucent emitting windows 28 and
(Continued)

23 for emitting light passing through the flow path being sealed and fixed to the junction block 14.

8 Claims, 8 Drawing Sheets

(58) Field of Classification Search
CPC ....... G01N 2021/052; G01N 2021/058; G01N 2021/3181; G01N 2021/8557; G01N 21/0303; G01N 21/27; G01N 21/31; G01N 21/3151; G01N 21/85; G01N 2201/08; H01L 21/02; H01L 21/67; H01L 21/67017; H01L 21/67253
See application file for complete search history.

(56) References Cited

U.S. PATENT DOCUMENTS

| | | |
|---|---|---|
| 2018/0217054 A1 | 8/2018 | Deguchi et al. |
| 2019/0271636 A1 | 9/2019 | Deguchi et al. |

FOREIGN PATENT DOCUMENTS

| | | |
|---|---|---|
| JP | 2003-207448 A | 7/2003 |
| JP | 2009-281476 A | 12/2009 |
| JP | 2011-196832 A | 10/2011 |
| JP | 2012-197941 A | 10/2012 |
| JP | 2017-211357 A | 11/2017 |
| JP | 2018-17644 A | 2/2018 |
| WO | 2013/161640 A1 | 10/2013 |
| WO | 2017/029792 A1 | 2/2017 |
| WO | 2018/021311 A1 | 2/2018 |

\* cited by examiner (a)

(b)

(a)

(b)

(a)

(b)

(a)

(b)

(a)

(b)

CONCENTRATION MEASUREMENT DEVICE

TECHNICAL FIELD

The present invention relates to a concentration measurement device, more particularly, to a concentration measurement device for detecting concentration of a gas based on an absorbance of light transmitted through a gas.

BACKGROUND OF INVENTION

A gas supply system used in semiconductor manufacturing equipment is configured to supply by switching a variety of gases to a process chamber via a flow controller provided for each gas type. The type of gas used in semiconductor manufacturing tends to increase year by year, and the number of gas supply lines and the number of fluid control devices used are also increasing.

For constructing a plurality of gas supply lines, an integrated gas supply system IGS (registered trademark) developed by the applicant of the present application is widely used. In the integrated gas supply system, each gas supply line is configured by arranging and fixing a flow path block (joint block), an on-off valve, a fluid controller, etc. on a base plate.

Further, in the integrated gas supply system, a configuration, in which an outlet side of each supply line is connected to a common manifold block (junction block) (for example, Patent Document 1), is known. An outlet of the manifold block connected to each line is connected to a process chamber via a flow path, it is possible to supply any gas by controlling the on-off valve provided in each supply line.

On the other hand, a concentration measurement device (in-line concentration measurement device) configured to be incorporated in a gas supply line to measure a gas concentration is known. Patent Document 2 discloses a concentration measurement device in which light of a predetermined wavelength is made incident from a light source through a light incident window to a measurement cell incorporated as a part of a flow path, and absorbance is measured from transmitted light passing through the measurement cell. From the measured absorbance, the concentration of the fluid can be determined according to the Lambert-Beer law, etc.

PRIOR-ART DOCUMENT

Patent Literature

Patent Document 1: Japanese Laid-Open Patent Publication No. 2012-197941
Patent Document 2: WO 2018/021311

SUMMARY OF INVENTION

Problems to be Solved by Invention

A conventional in-line concentration measurement device is provided separately downstream of the integrated gas supply system, and more specifically, in the middle of the flow path between the integrated gas supply system and the process chamber. For example, a reflection type concentration measurement device using a vertical type measurement cell described in Patent Document 2 (the type in which the flow path in the measurement cell is perpendicular to the line flow path) is a relatively compact design, since a mounting portion of an optical system is aggregated to the upper end of the measurement cell, installation is relatively easy, even in the middle of the flow path.

However, although the conventional concentration measurement device is becoming more and more compact, it is necessary to secure a space for installation. Thus, for recent semiconductor manufacturing equipment, in which various devices are connected and almost no surplus space around it, an in-line concentration measurement device incorporated into a gas supply system and capable of appropriately measuring the concentration of gas without requiring much installation space, has been on demand.

The present invention has been made in view of the above-mentioned problem, and its main object is to provide a concentration measurement device being incorporated in a gas supply system in a compact manner.

Means for Solving Problem

The concentration measurement device according to an embodiment of the present invention is a concentration measurement device configured to measure a concentration of a gas flowing through a junction block connected to a plurality of gas supply lines, the concentration measurement device comprises a light source for generating light incident to a flow path formed in the junction block, a photodetector for receiving light emitted from the flow path, and an arithmetic control circuit for calculating the concentration of the gas flowing through the flow path based on an output of the photodetector, at least one of a translucent incident window for making light from the light source incident to the flow path and a translucent emitting window for emitting light passing through the flow path is sealed and fixed to the junction block.

In one embodiment, the junction block includes a plurality of sub-flow paths respectively connected to the plurality of gas supply lines, and a main flow path connected to the plurality of sub-flow paths, wherein the incident window and the emitting window are sealed and fixed to both ends of the main flow path.

In one embodiment, the incident window is sealed and fixed to the junction block by a first sealing member having a collimator, the light source and the first sealing member are connected by an optical transmission path member; the emitting window is sealed and fixed to the junction block by a second sealing member, the photodetector and the second sealing member are connected by an optical transmission path member.

In one embodiment, the incident window is sealed and fixed to the junction block by a first sealing member having the light source and collimator; the emitting window is sealed and fixed to the junction block by the second sealing member having the photodetector.

In one embodiment, the junction block includes a plurality of sub-flow paths respectively connected to the plurality of gas supply lines, and a main flow path connected to the plurality of sub-flow paths, wherein the incident window is a common window member that also serves as the emitting window, the common window member is sealed and fixed to one end of the main flow path, and a reflecting member for reflecting light incident to the flow path is fixed to the main flow path.

In one embodiment, the optical transmission path member for connecting the common window member and the light source, and the optical transmission path member for connecting the common window member and the photodetector are provided separately.

In one embodiment, the junction block includes a plurality of sub-flow paths respectively connected to the plurality of gas supply lines, and a main flow path connected to the plurality of sub-flow paths, the incident window is a common window member which also serves as the emitting window, the common window member is fixed so as to seal a measurement hole portion, a reflecting member for reflecting the light incident to the measurement hole portion is arranged so as to face the common window member.

In one embodiment, a supporting member connected to the sealing member for sealing and fixing the common window member is provided, the supporting member extends along the measurement hole, and the reflection member is supported by the supporting member.

In one embodiment, the main flow path is formed by a through hole extending along a longitudinal direction of the junction block, and each of the plurality of the sub-flow paths is formed by a hole extending in a direction intersecting with the main flow path and provided so as to reach the main flow path from the surface of the junction block.

In one embodiment, the junction block is a flow path block fixed on a base plate on an outlet side of an integrated unit, in which the plurality of gas supply lines are formed on the base plate.

EFFECT OF INVENTION

According to the embodiments of the present invention, a concentration measurement device capable of being integrated into a gas supply system in a compact manner is provided.

DETAILED DESCRIPTION OF EMBODIMENT

Embodiments of the present invention will be described below with reference to the drawings, but the present invention is not limited to the following embodiments. Further, during the actual use of the device, it is possible to appropriately set the direction of the arrangement, such as turning upside down in the vertical direction, or changing from vertical direction to horizontal direction.

Figure 1:
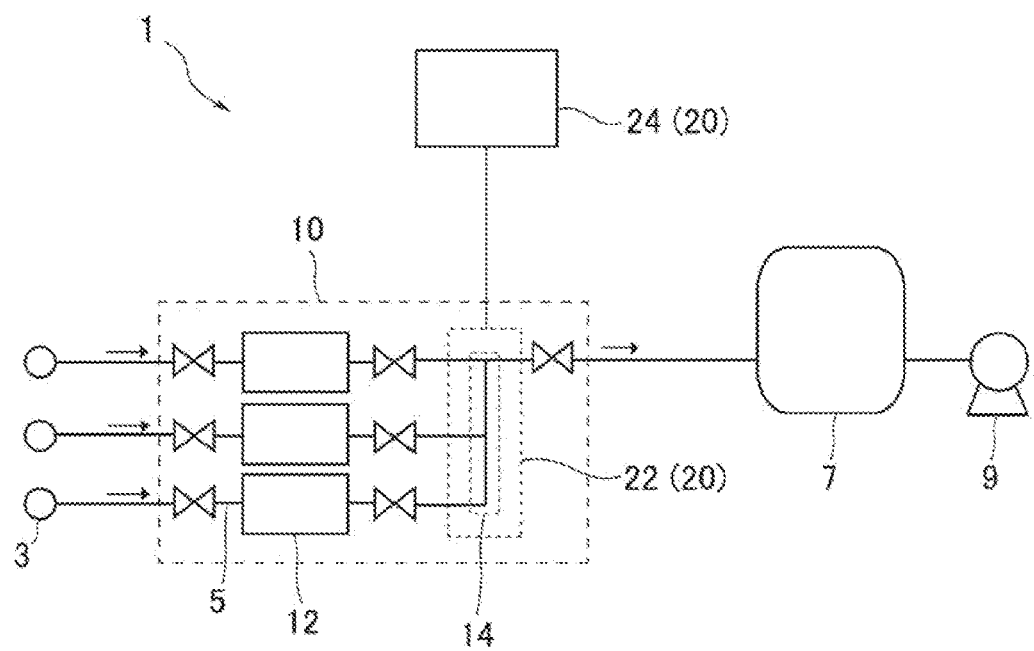
FIG. 1 shows a gas supply system incorporating the concentration measurement device according to the embodiments of the present invention.

FIG. 1 shows a gas supply system 1 incorporating the concentration measurement device according to the embodiment of the present invention. The gas supply system 1 is configured so that the gas from a gas supply source 3 can be supplied to a process chamber 7 of a semiconductor manufacturing equipment, via an integrated unit 10 provided with a plurality of gas supply lines 5. A vacuum pump 9 is connected to the process chamber 7, gas supply may be performed in a state where the process chamber 7 and the flow path are evacuated.

The integrated unit 10 has a configuration in which the plurality of supply lines 5 are provided on a base plate. In each supply line 5, a flow path block (joint block), an on-off valves, a filter, and the like are fixed by screws or the like on the base plate and interconnected, for example, via a metal gasket in any mode. Using a flow rate control device 12 provided in each supply line 5, the integration unit 10 is able to individually control the gas flow rate. For simplicity, FIG. 1 shows only the flow rate control devices 12, the on-off valves in front of or behind it, and the outlet on-off valve after merging, however, it is needless to say that other various elements such as a bypass flow path may be provided as necessary.

In the gas supply system 1, each supply line 5 provided in the integrated unit 10 is connected to a junction block 14 disposed on an outlet side of the integrated unit 10. The junction block 14 is a manifold block having a plurality of sub-flow paths connected to each supply line 5 and one main flow path commonly connected to the plurality of sub-flow paths, it is also a flow path block fixed on the base plate at the outlet side of the integrated unit 10. The outlet of the junction block 14 is connected to the process chamber 7 and is able to supply any gas from each supply line via the junction block 14. The plurality of junction blocks 14 may be provided in the integrated unit 10, in this case, a portion of the supply line is connected to each junction block.

In addition, the concentration measurement device 20 according to one embodiment of the present invention comprises a gas unit 22 formed by using the above-mentioned junction block 14 and an electric unit 24 optically or electrically connected to the gas unit 22 and is configured to be able to measure concentration of the gas flowing through the junction block 14.

The gas unit 22 constructing the concentration measurement device 20 is preferably formed by using an optical system having high temperature resistance because its temperature may become high depending on the gas temperatures (e.g., 100° C. to 150° C.). On the other hand, the electric unit 24 is typically provided in a room temperature environment separated from the gas unit 22, so it is less susceptible to the influence of temperatures. Hereinafter, the concentration measurement device according to Embodiments 1 to 5 will be described in detail.

Embodiment 1

Figure 2:
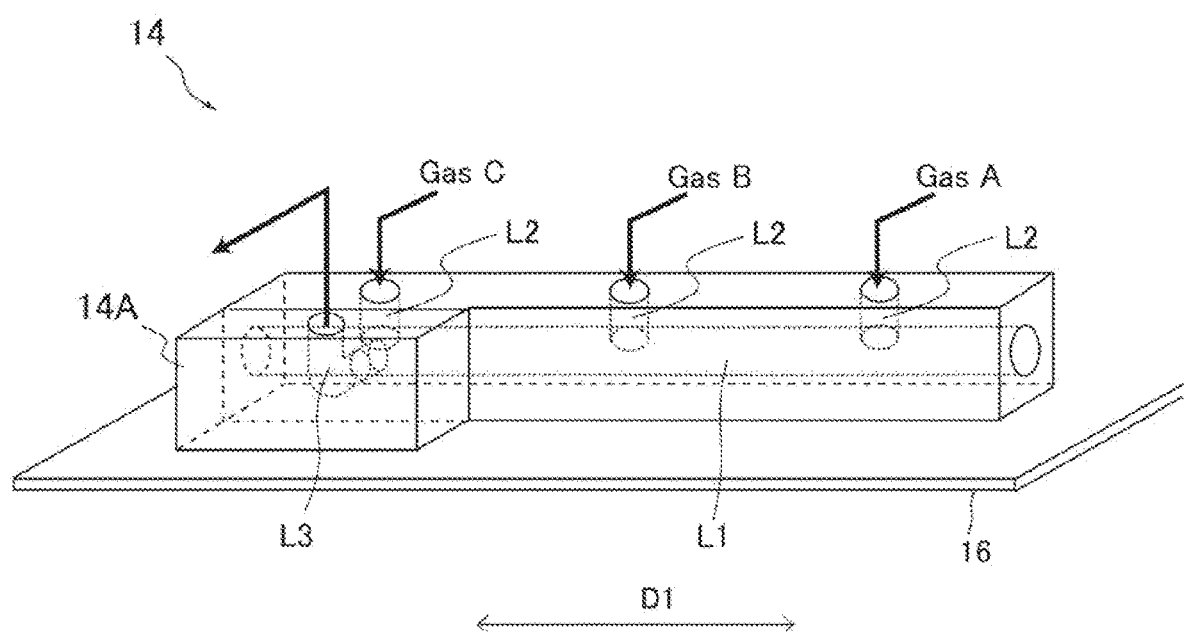
FIG. 2 is a perspective view showing a junction block provided with a gas unit of the concentration measurement device in Embodiment 1.

FIG. 2 is a perspective view showing the junction block 14 in which the gas unit 22 constructing the concentration measurement device 20 of Embodiment 1 is formed, FIGS. 3(a) and 3(b) are a vertical cross-sectional view and a side view showing the gas unit 22 provided in the junction block 14.

As shown in FIG. 2, the junction block 14 used in the present embodiment is fixed on a base plate 16 provided with an integrated unit and has a main flow path L1 formed by an elongated through hole extending along the longitudinal direction D1 of the junction block 14. Further, a plurality of sub-flow paths L2 are connected to the main flow path L1. Each of the sub-flow paths L2 is formed by a hole provided so as to reach the main flow path from the upper surface of the junction block 14 and extends in a direction (here perpendicular direction) intersecting the main flow path L1.

The through-holes and holes forming the main flow path L1 and the sub-flow paths L2 can be easily formed in the junction block 14 by drilling. As same as other flow path blocks constituting the integrated unit, the junction block 14 may be made of, for example, stainless steel (particularly SUS316L).

Each supply line provided in the integrated unit (more specifically, the outlet of the on-off valve provided in the final stage of each line) is connected to the opening portion of the inlet side of the sub-flow path L2 formed on the upper surface of the junction block 14. In this configuration, Gas A, Gas B, and Gas C flowing through any of the supply lines of the integrated unit may flow through the sub-flow path L2 of the junction block 14 to the main flow path L1. In the embodiments shown in FIG. 2 and FIG. 3, a triple block connected to three supply lines is used as the joining block 14, but the invention is not limited to this, and a block connected to any number of the gas supply lines may be used.

Further, an outlet block 14A, in which an L-shaped outflow path L3 communicating with the main flow path L1 is formed, is fixed to the junction block 14. In addition, a flow path for connecting the outflow path L3 of the outlet block 14A and the main flow path L1 is formed in the junction block 14. The outlet block 14A is firmly fixed by screwing to the junction block 14 via a gasket, so that gas can flow out through the outflow path L3 from the main flow path L1.

The opening portion of the outflow path L3 formed on the upper surface of the outlet block 14A is connected to an on-off valve (not shown) (shut-off valve). By using the shut-off valve, it is possible to stop the gas flow from the integrated unit more reliably. Further, the outflow path of the shut-off valve is connected to the flow path block provided with a tubular joint serving as a gas outlet, gas is supplied downstream of the flow path and to the process chamber through the tubular joint when opening the shut-off valve.

Figure 4:
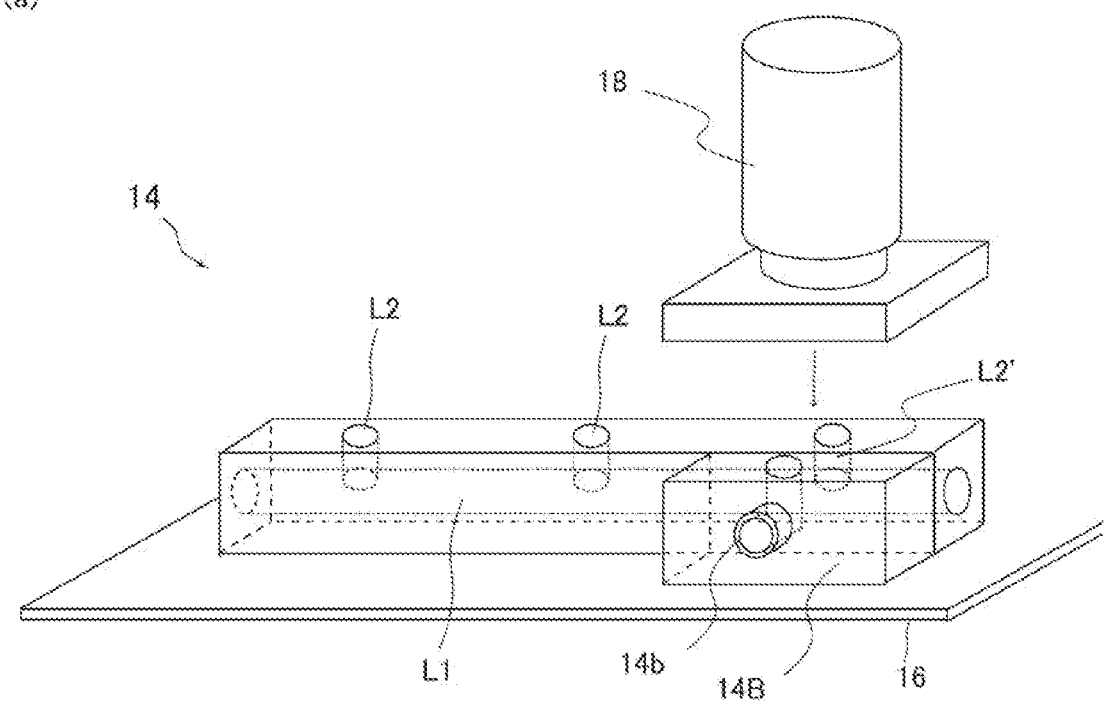
FIG. 4 shows a junction block in another embodiment, where 4(a) is a perspective view and 4(b) is a side view.
Figure 4:
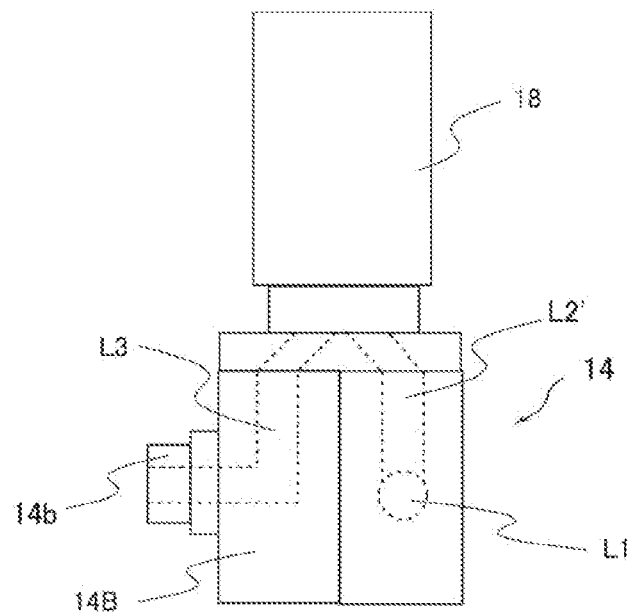

Regarding the junction block 14, as long as it has a plurality of sub-flow paths L2 and a main flow path L1 and is fixed to the base plate 16, various things other than the embodiment shown in FIG. 2 may be used. FIGS. 4(a) and 4(b) show a junction block 14 in another embodiment. The junction block 14 shown in FIGS. 4(a) and 4(b) has a joint portion 14b on a side surface and is configured using an outlet block 14B provided with to L-shaped outflow path L3 communicating the joint portion 14b and the upper opening portion. The outflow path L3 of the outlet block 14B, different from the outflow path L3 of the outlet block 14A shown in FIG. 2, is not directly communicated with the main flow path L1.

In the junction block 14 shown in FIGS. 4(a) and 4(b), the upper surface opening portion of the outlet sub-flow path L2' (one of the sub-flow paths) and the upper surface opening portion of the outlet block 14B are connected to a shut-off valve 18 disposed so as to straddle both. In this configuration, the outlet sub-flow path L2' communicating with the main flow path L1 is used to flow the gas from the main flow path L1 to the outflow path L3 of the outlet block 14B via the shut-off valve 18. Then, gas may be supplied from the side joint portion 14b of the outlet block 14B to the process chamber through the flow path.

As described above, various types of junction block 14 can be used, but an example of forming the gas unit 22 using the junction block 14 shown in FIG. 2 will be described below. However, it is obvious that, in the junction block 14 of other embodiments, it is possible to form the gas unit 22 as same as the embodiment described below.

FIGS. 3(a) and 3(b) show the configuration of the gas unit 22 of the concentration measurement device 20 of the present embodiment. As shown in FIG. 3(a), the gas unit 22 has a translucency incident window 26 and a translucency emitting window 28 disposed at the ends of the main flow path L1 of the junction block 14. The incident window 26 and the emitting window 28 are sealed and fixed to both ends of the junction block 14 using sealing members 27 and 29.

In the present embodiment, the main flow path L1 is formed by respectively sealing both ends of the through hole formed so as to extend along the longitudinal direction of the junction block 14, by using the sealing members 27 and 29 (here, blind joint). Then, an optical system of the gas unit 22 constituting the concentration measurement device 20 is arranged by using the sealing members.

In the sealing member 27 for fixing the incident window 26 (hereinafter, sometimes referred to as the first sealing member), a collimator is provided. Further, in the sealing member 29 for fixing the emitting window 28 (hereinafter, sometimes referred to as the second sealing member), a condenser lens is provided. The incident window 26 and the emitting window 28 are arranged so as to face each other, sandwiching the main flow path L1, and enable the light incident to the incident window 26 and traveling straight through the main flow path L1 to emit from the emitting window 28. The main flow path L1 of the junction block 14 is utilized as an optical path of the measurement light.

In the first sealing member 27 for fixing the incident window 26, an optical transmission path member connected to the collimator, specifically, an optical fiber 30 is provided. The optical fiber 30 is used for transmitting the measurement light (here ultraviolet light) from the electric unit 24 to the gas unit 22. The transmitted light, after being converted into parallel light by the collimator, is incident to the main flow path L1 via the incident window 26.

Further, in the second sealing member 29 for fixing the emitting window 28, an optical fiber 31 is provided for receiving light condensed by a condenser lens. The optical fiber 31 is used for transmitting light passing through the main flow path L1 of the gas unit 22 to the electric unit 24.

In the present specification, the so-called light includes not only visible light but also at least infrared light and ultraviolet light and may include electromagnetic waves of any wavelength. In addition, the translucency means that the internal transmittance with respect to the light incident to the main flow path L1 is sufficiently high to enable concentration measurement.

The incident window 26 and the emitting window 28 are made of, for example, circular sapphire plates having a thickness of 0.5 mm to 2 mm and a diameter of 5 mm to 30 mm. As the incident window 26 and the emitting window 28, sapphire is preferably used, because it has resistance and high transmittance with respect to detection light used for concentration measurement such as ultraviolet light or the like, and is mechanically and chemically stable, but other stable materials, for example, quartz glass, may also be used.

In order to seal and fix the incident window 26 and the emitting window 28 to the main flow path L1 more reliably, metal gaskets (e.g., made of SUS316L) may be provided between the incident window 26 and the first sealing member 27 and between the emitting window 28 and the second sealing member 29. The metal gasket may be provided with an annular convex portion which is crushed to improve sealing properties. Sealing can be ensured by replacing the metal gasket with a new one when replacing the incident window 26 and emitting window 28.

In the mounting portions of the incident window 26 and the emitting window 28 in the junction block 14, as shown in FIG. 3(a), an enlarged diameter portion of the end of the main flow path L1 may be formed, by supporting the peripheral portions of the incident window 26 and the emitting window 28 on the bottom surfaces (support surfaces) of the enlarged diameter portions, it is possible to seal and fix the incident window 26 and the emitting window 28 stably with high sealing property. On the support surfaces of the enlarged diameter portions, recesses having a shape compatible with the incident window 26 and emitting window 28 for fitting may be formed. Further, between the support surfaces of the enlarged diameter portions and the incident window 26 and emitting window 28, metal gaskets with the annular convex portion described above may be placed to improve sealing property and maintainability.

The blind joints used as the first and second sealing members 27 and 29 may be metal plugs having sealant-applied male screw on the circumferential surface. By screwing the male screws into the female screws formed at both ends of the junction block 14, it is possible to seal and fix the incident window 26 and the emitting window 28 with pressing against the support surfaces. However, the first and second sealing members 27 and 29 may be any mode as long as they can fix the incident window 26 and the emitting window 28 while appropriately sealing the main flow path L1, for example, it may be fixed by caulking.

The gas unit 22 configured as described above can receive incident light from the electric unit 24 provided spaced apart and send light after passing through the main flow path L1 to the electric unit 24. Since the gas unit 22 is formed using the junction block 14 of the integrated unit, it can be compactly incorporated into the gas supply system with a relatively simple configuration, so as to reduce the installation space of the gas unit that has been conventionally required. Further, as the electric unit 24, a conventional unit can be used to achieve cost reduction.

Figure 5:
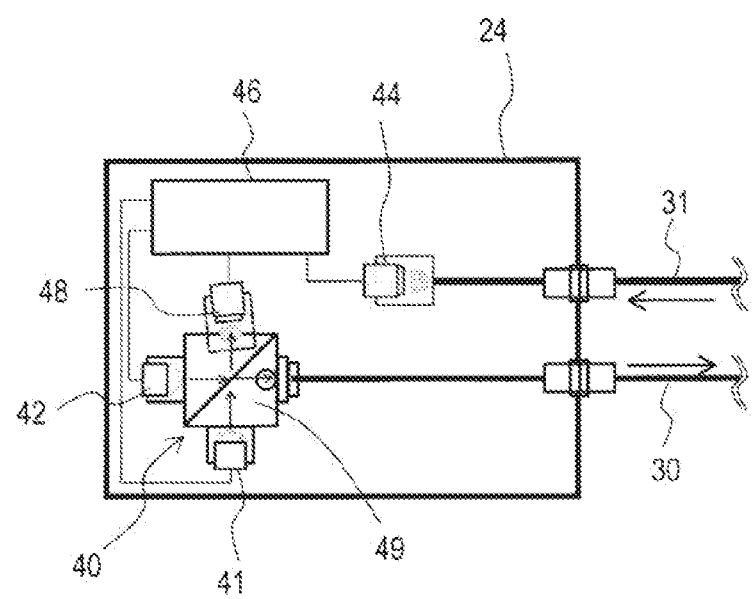
FIG. 5 is a diagram showing an electric unit of the concentration measurement device according to Embodiment 1.

FIG. 5 shows a configuration of the electric unit 24 used in the present embodiment. As shown in FIG. 5, the electric unit 24 includes a light source 40 for generating light incident to the junction block 14 (see FIG. 3), a photodetector 44 for receiving light emitted from the junction block 14, and an arithmetic control circuit 46 for determining the concentration of the gas by calculation based on a detection signal (detection signal corresponding to the intensity of the received light) output from the photodetector 44. Further, in the electric unit 24, a reference photodetector 48 for receiving the reference light from the light source 40 is also provided. In the present embodiment, the electrical unit 24 is optically connected to the gas unit 22 by optical fibers 30 and 31.

The light source 40 includes two light emitting elements (here LEDs) 41 and 42 that emit ultraviolet light of different wavelengths. In the light emitting elements 41 and 42, driving currents of different frequencies are flowed using an oscillation circuit, by performing frequency analysis (e.g., Fast Fourier Transform or wavelet transform), it is possible to measure the intensity of the light corresponding to each wavelength component based on the detection signal detected by the photodetector 44.

As the light emitting elements 41 and 42, a light emitting element other than LED, for example, an LD (laser diode) may also be used. Further, instead of using a multiplexed light of a plurality of different wavelengths as the light source, a light source of a single wavelength may also be utilized, in this case, the multiplexer and the frequency analysis circuit may be omitted. Three or more light emitting elements may be provided; it may also be configured to generate incident light using only any single selected light emitting element among those provided. A temperature measurement resistor may also be attached to the light source 40. Moreover, the light emitted by the light emitting element is not limited to ultraviolet light, it may also be visible light or infrared light. The wavelength of the light may be appropriately selected based on the extinction characteristics of the gas to be measured, but in the present embodiment, ultraviolet light is used to measure the concentration of an organometallic gas (e.g., trimethylgallium (TMGa) or trimethylaluminum (TMAl)) that absorbs ultraviolet light.

The light source 40 and the reference photodetector 48 are attached to a beam splitter 49. The beam splitter 49 functions to direct a portion of the light from the light source 40 to the reference photodetector 48 and the remaining light to the gas unit 22 through the optical fiber 30. As the light receiving element constituting the photodetector 44 and the reference photodetector 48, a photodiode or a phototransistor is preferably used.

The arithmetic control circuit 46 is configured of, for example, a processor or a memory provided on a circuit board and includes a computer program for executing a predetermined arithmetic operation based on an input signal and can be realized by a combination of hardware and software. Although the arithmetic control circuit 46 in the illustrated embodiment is incorporated in the electrical unit 24, a part of the component (such as a CPU) or all may be provided outside the electrical unit 24.

In the concentration measurement device 20 described above, the light having a wavelength λ passing through the main flow path L1 of the junction block 14 is absorbed by the gas existing in the main flow path L1 in accordance with the concentration of the gas. Then, the arithmetic control circuit 46 can measure the absorbance Aλ at the wavelength λ by analyzing the frequency of the detection signal from the photodetector 44 and can further calculate the molar concentration $C_M$ from the absorbance Aλ based on the Lambert-Beer law shown in the following equation (1):

$$A\lambda = -\log_{10}(I/Io) = \alpha' L C_M \qquad (1)$$

In the above equation (1), $I_0$ is the intensity of the incident light incident on the main flow path L1, I is the intensity of the light passing through the gas in the main flow path L1, α' is the molar extinction coefficient (m²/mol), L is the optical path length (m) of the main flow path L1, and $C_M$ is the molar density (mol/m³). The molar extinction coefficient α' is a coefficient determined by substance. $I/I_0$ is generally referred to as transmittance, the absorbance Aλ becomes 0 when the transmittance $I/I_0$ is 100%, and the absorbance $A\lambda$ becomes infinite when the transmittance $I/I_0$ is 0%.

Figure 3:
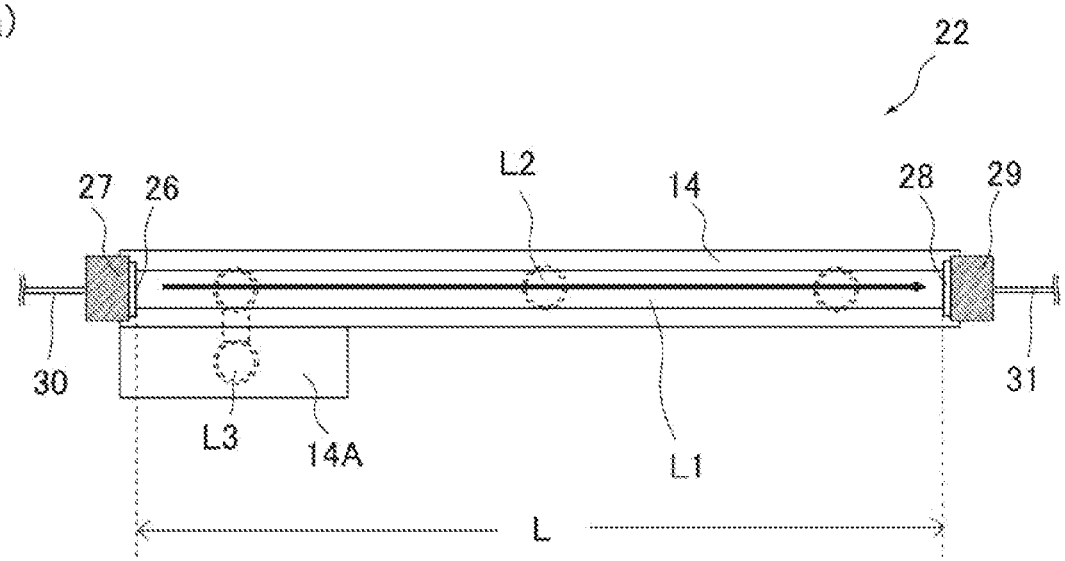
FIG. 3 shows the gas unit of the concentration measurement device in Embodiment 1, where 3(a) is a vertical cross-sectional view when viewed from above, and 3(b) is a side view.
Figure 3:
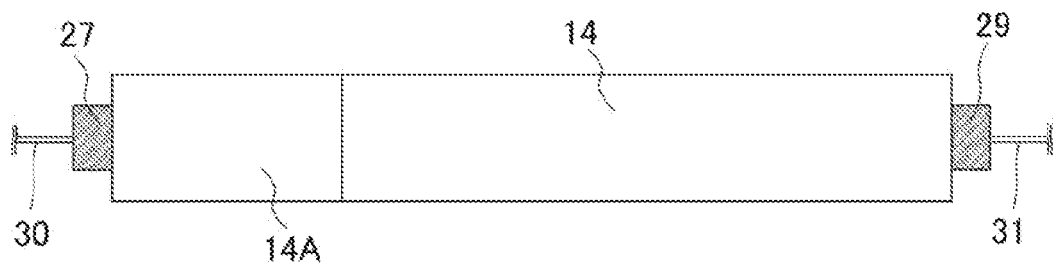

In addition, for the intensity $I_0$ of the incident light in the above equation, when there is no absorbing gas in the main flow path L1 (e.g., when a gas that does not absorb ultraviolet light is filled, or when it is vacuumed), the intensity of the light detected by the photodetector 44 may be regarded as the intensity $I_0$ of the incident light. Further, the optical path length L of the main flow path L1, as shown in FIG. 3, is the distance from the surface of the gas contact side of the incident window 26 to the surface of the gas contact side of the emitting window 28, and this distance is previously known.

As described above, the concentration measurement device 20 of the present embodiment can determine the concentration of the gas based on the absorbance of the light passing through the main flow path L1. However, the concentration measurement device 20 may be configured to determine the concentration of the gas in consideration of the pressure and temperature of the gas flowing through the main flow path L1 of the junction block 14. Hereinafter, an embodiment of obtaining the concentration of the measurement gas (that is, the gas to be measured) contained in a mixed gas in consideration of the pressure and temperature will be described.

As described above, the Lambertian-Beer equation (1) holds, but the above molar concentration $C_M$ refers to the amount of the gas per unit volume, and therefore can be expressed as $C_M=n/V$. Where n is the mass (mol) of the gas, i.e., the number of moles, and V is the volume (m³) of the gas.

Then, since the object to be measured is a gas, the molar concentration $C_M=n/V=P/RT$ is derived from the ideal gas law that PV=nRT. When this is substituted into the Lambert-Beer equation and $-\ln(I/I_0)=\ln(I_0/I)$ is applied, the following equation (2) can be obtained.

$$ln(I_0/I) = \alpha L(P/RT) \quad (2)$$

In the equation (2), R is the gas constant=0.0623 (Torr·m³/K/mol), P is the pressure (Torr), and T is the temperature (K). The molar extinction coefficient $\alpha$ in the equation (2) is the molar extinction coefficient $\alpha$ with respect to the natural logarithm of the transmittance and satisfies the relationship $\alpha'=0.434\, \alpha$ with respect to the $\alpha'$ in the equation (1).

Here, the pressure that can be detected by the pressure sensor is the total pressure Pt (Torr) of the mixed gas containing the measurement gas and the carrier gas. On the other hand, the gas related to absorption is only the measurement gas, and the pressure P in the above equation (2) corresponds to a partial pressure Pa of the measurement gas. Therefore, if the partial pressure Pa of the measurement gas is expressed by the equation (2) using Pa=Pt·Cv, which is an equation expressed by the concentration Cv (volume %) of the measurement gas in the entire gas and the total pressure Pt, the relationship between the concentration (volume %) of acetone in consideration of the pressure and temperature and the absorbance can be expressed by an equation (3) below using the absorption coefficient $\alpha_a$ of the measurement gas:

$$ln(I_0/I) = \alpha_a L(Pt \cdot Cv/RT) \quad (3)$$

In addition, when the equation (3) is modified, the following equation (4) can be obtained.

$$Cv = (RT/\alpha_a LPt) \cdot \ln(I_0/I) \quad (4)$$

Therefore, according to the equation (4), on the basis of each measured value (gas temperature T, total pressure Pt, and transmitted light intensity I), it is possible to determine the measurement gas concentration in the measurement light wavelength (volume %) by calculation. In this manner, the concentration of the absorption gas in the mixed gas can be obtained in consideration of the gas temperature and the gas pressure. The extinction coefficient $\alpha_a$ can be determined in advance according to the equation (3) or (4) from the measured values (T, Pt, I) when a measurement gas having a known concentration (e.g., 100% concentration) is flowed. The extinction coefficient $\alpha_a$ obtained in this manner is stored in a memory, and the extinction coefficient $\alpha_a$ can be read out from the memory and used in performing the concentration calculation of the measurement gas of unknown concentration based on the equation (4).

The temperature sensor for measuring the gas temperature T flowing through the main flow path L1, may be separately attached to the junction block 14, or, if the flow rate control device 12 provided in the integrated unit has a temperature sensor, the output of the temperature sensor may be used as the gas temperature T. In addition, the pressure sensor for measuring the total pressure Pt may be separately attached to the junction block 14, or, if the flow rate control device 12 has a downstream pressure sensor, it may also be used to measure the total pressure Pt.

Embodiment 2

Figure 6:
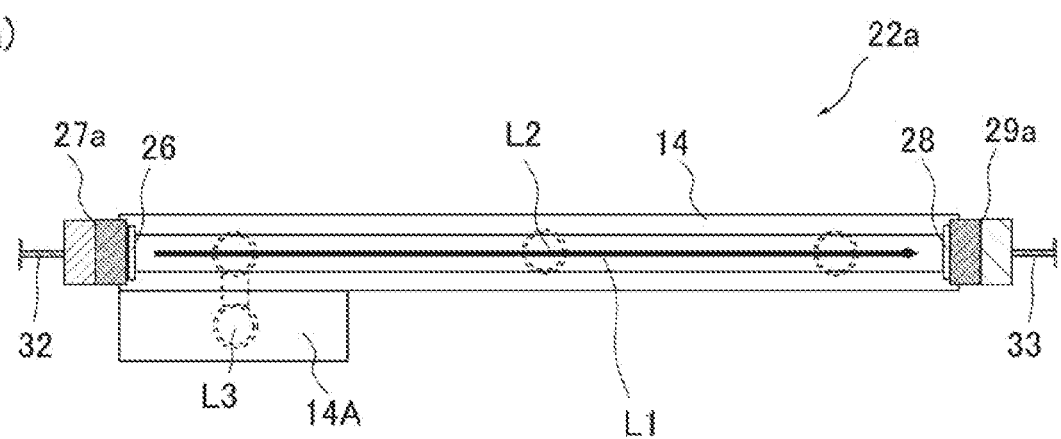
FIG. 6 shows the gas unit of the concentration measurement device in Embodiment 2, where 6(a) is a vertical cross-sectional view when viewed from above, and 6(b) is a side view.
Figure 6:
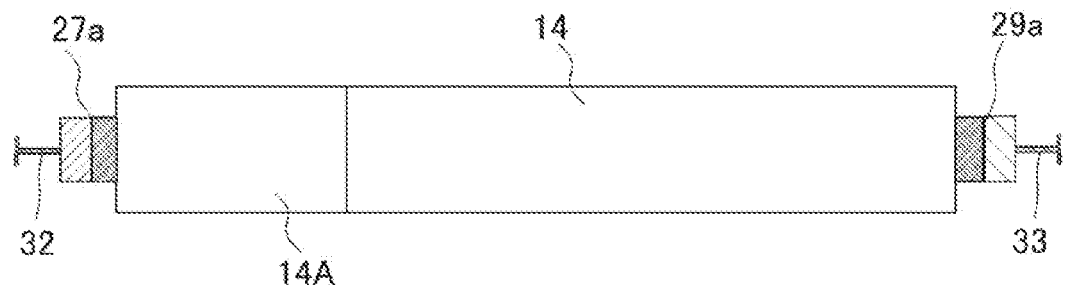

FIGS. 6(a) and 6(b) are a vertical cross-sectional view and a side view showing a gas unit 22a provided in the concentration measurement device of Embodiment 2. Also, in the present embodiment, the gas unit 22a is configured by utilizing the junction block 14 fixed to the integrated unit (See FIGS. 2 and 4). Hereinafter, the same components as those of the first embodiment are denoted by the same reference numerals, and a detailed description thereof may be omitted.

In the gas unit 22a of the present embodiment, a LED built-in sealing member 27a, which is also utilized as the light source, and a photodiode built-in sealing member 29a, which is also utilized as a photodetector, are provided at each end of the junction block 14. The sealing member 27a is used to seal and fix the incident window 26, and the sealing member 29a is used to seal and fix the emitting window 28.

As described above, since the gas unit 22a of the present embodiment is configured to include a light source and a photodetector, it is not necessary to provide a light source and a photodetector in the electric unit connected to the gas unit 22a. In the present embodiment, the electric unit may include an arithmetic control circuit 46 as same as that of Embodiment 1.

In the concentration measurement device of the present embodiment, the gas unit 22a receives a signal from the arithmetic control circuit provided in the electric unit for controlling the light emission of the LED built in the sealing member 27a via a wiring cable 32, and make the measurement light incident to the main flow path L1 through the incident window 26. Further, the light passing through the main flow path L1 is received by the photodiode of the sealing member 29a through the emitting window 28. Then, it is converted into an electric signal by the photodiode and is sent to the arithmetic control circuit of the electric unit via the wiring cable 33. In the same manner as in Embodiment 1, the arithmetic control circuit can calculate the concentration of the gas flowing through the main flow path L1 based on the received electric signal.

The concentration measurement device of Embodiment 2 as described above is also a relatively simple configuration and can be compactly incorporated into the gas supply system to reduce the installation space which has been conventionally required in the gas unit.

Embodiment 3

Figure 7:
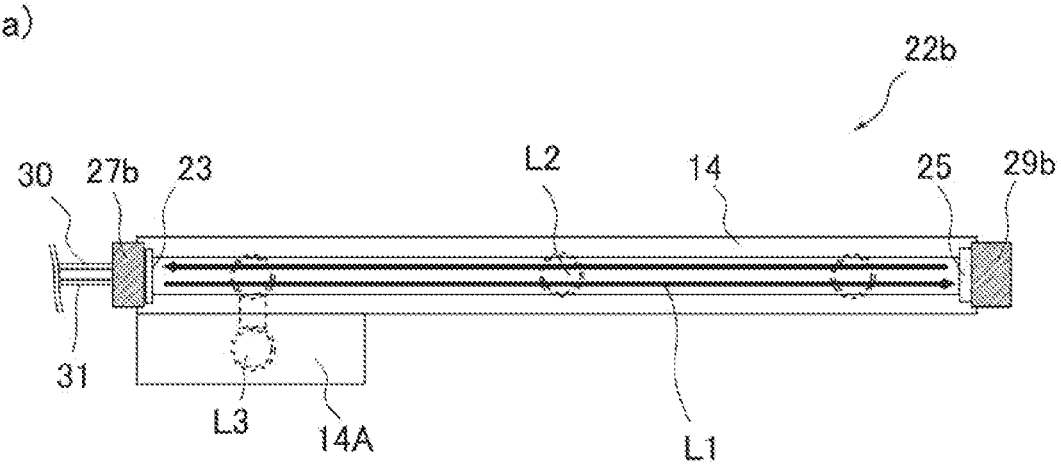
FIG. 7 shows a gas unit of the concentration measurement device in Embodiment 3, where 7(a) is a vertical cross-sectional view when viewed from above, and 7(b) is a side view.
Figure 7:
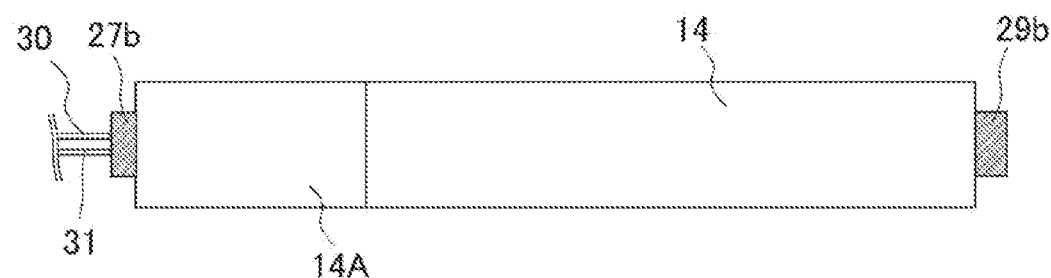

FIGS. 7(a) and 7(b) are a longitudinal sectional view and a side view showing a gas unit 22b having a concentration measurement device of Embodiment 3. Also in the present embodiment, the gas unit 22b is configured by utilizing a junction block 14 fixed to the integrated unit (see, FIGS. 2 and 4). Hereinafter, the same components as those of Embodiment 1 are denoted by the same reference numerals, and a detailed description thereof may be omitted.

In the gas unit 22b of the present embodiment, a common window member 23, which serves as both the incident window and emitting window, is sealed and fixed to one end of the junction block 14 by a sealing member 27b. In addition, a reflective member 25 is sealed and fixed to the other end of the junction block 14 by a sealing member 29b. The reflecting surface of the reflecting member 25 is provided perpendicular to the traveling direction of the incident light or the central axis of the flow path. Thus, it is possible to reflect the light traveling straight through the main flow path L1 in the same direction.

The reflecting member 25 may be, for example, an aluminum layer, serving as a reflective layer formed by sputtering on the back surface of a sapphire plate (emitting window 28 of Embodiments 1 and 2). Further, the reflecting member 25 may include a dielectric multilayer film as the reflecting layer, by using the dielectric multilayer film, it is possible to selectively reflect light having a specific wavelength range (e.g., near ultraviolet). The dielectric multilayer film is configured of a laminate of a plurality of optical coatings having different refractive indices (a laminate of high refractive index thin films and low refractive index thin films), by appropriately selecting the thickness and the refractive index of each layer, it is possible to reflect or transmit light of a specific wavelength.

Further, since the dielectric multilayer film can reflect light at an arbitrary ratio, for example, when the incident light is reflected by the reflecting member 25, rather than reflecting 100% of the incident light, a part (e.g., 10%) is made to transmit, such as by a photodetector provided outside the reflecting member 25, it may also receive the transmitted light, and use the transmitted light as a reference light.

The gas unit 22b of the present embodiment is optically connected to the electric unit 24 as the same manner as that in Embodiment 1. However, since the incident and emitting light are performed at one end of the junction block 14, both the optical fiber 30 for incidence and the optical fiber 31 for emitting are connected to the sealing member 27b.

In the concentration measurement device of the present embodiment, the light from the light source 40 provided in the electric unit 24 is guided to the common window member 23 of the main flow path L1 by the optical fiber 30, and incident to the main flow path L1, from the common window member 21. Further, the light passing through the main flow path L1 and being reflected by the reflective member 25 is emitted from the common window member 23 and guided to the photodetector 44 of the electric unit by the optical fiber 31.

Thus, by providing the optical fiber 30 for guiding light to the main flow path L1, and the optical fiber 31 for guiding light emitted from the main flow path L1 separately, it is possible to reduce the influence of stray light. However, in another embodiment, the light source and the measuring photodetector may be connected to the measurement cell by a single optical transmission path member serving for both the incident light and the emitted light, such as an optical fiber bundle.

The configuration of the reflection type concentration measurement device is described in, for example, Patent Document 2. In the present embodiment, for the design of the optical system, it is possible to utilize various modes described in Patent Document 2.

The concentration measurement device of Embodiment 3 configured as described above is a relatively simple configuration and can be compactly incorporated into the gas supply system, so that it is possible to reduce the installation space of the gas unit which has been conventionally required.

Further, in the present embodiment, the optical path length L of the main flow path L1 is defined as twice the distance from the surface of the gas contact side of the incident window 26 to the surface of the gas contact side of the reflecting member 25. Therefore, it is possible to obtain twice the optical path length while having the same dimensions. Thus, in spite of the miniaturization, measurement accuracy may be improved also. Further, in the concentration measurement device of Embodiment 3, since light incident and light emission are performed only on one side of the junction block 14, it is possible to reduce the number of parts.

Embodiment 4

Figure 8:
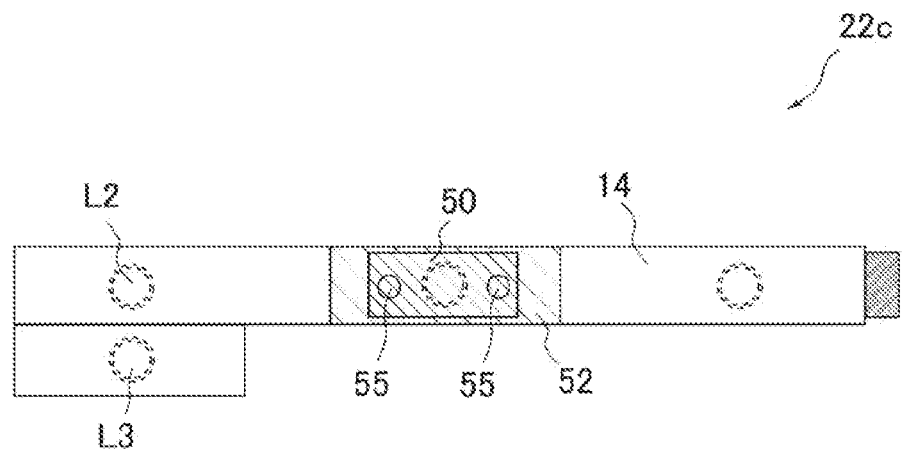
FIG. 8 show a gas unit of the concentration measurement device in Embodiment 4, where 8(a) is a top view, and 8(b) is a cross-sectional view.
Figure 8:
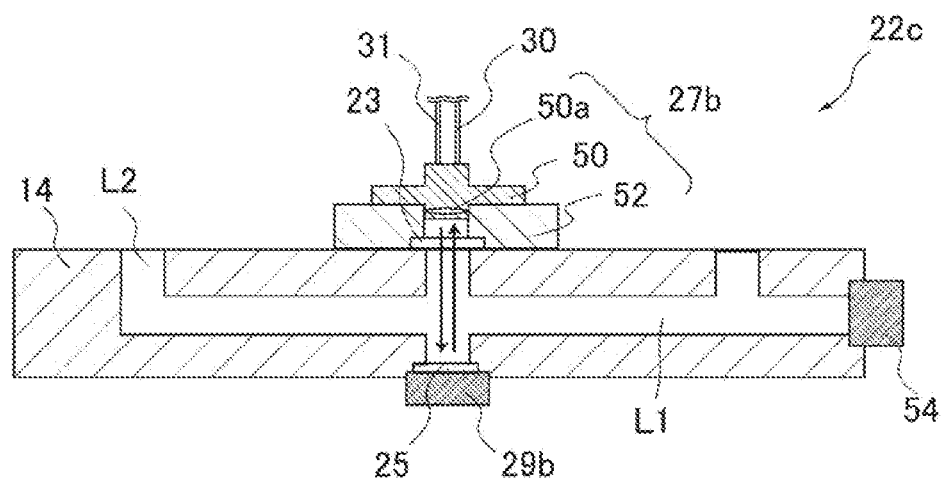

FIGS. 8(a) and 8(b) are a top view and a lateral cross-sectional view showing the gas unit 22c included in the concentration measurement device of Embodiment 4. The gas unit 22c of the present embodiment is also configured by utilizing the junction block 14 fixed to the integrated unit. Hereinafter, the same components as those in Embodiment 3 are denoted by the same reference numerals, and a detailed description thereof may be omitted.

Different from the Embodiments 1 to 3, the gas unit 22c of the present embodiment is configured to make the light incident in the same direction as the sub-flow path L2 rather than the main flow path L1, and to measure the intensity of the transmitted light. The gas unit 22c utilizes one of the sub-flow paths L2 for the arrangement of the optical system, and the optical system for concentration measurement is provided on the upper surface of the junction block 14. In addition, the gas unit 22c constitutes a reflection type concentration measurement device, similarly to Embodiment 3. Hereinafter, in order to distinguish the sub-flow path L2 provided with the sub-flow path L2 optical system from the sub-flow path L2 connected to the gas supply line, sometimes it is referred to as a measurement hole. The measurement hole is typically a hole extending in a direction parallel to the sub-flow path L2.

The gas unit 22c includes a collimator 50 provided on the upper surface of the junction block 14 and a window holding member 52 for sealing and fixing a common window member 23. The collimator 50 and the window holding member 52 functions as a sealing member 27b. A collimator lens 50a is provided in the collimator 50, and it is capable of converting the light from the optical fiber 30 into parallel light to pass through the common window member 23 along the direction of the sub-flow path L2 and incident to the measurement hole. The collimator 50 and the window holding member 52 can be fixed to the junction block 14 by inserting a bolt into the bolt hole 55.

Further, on the lower surface side of the junction block, the reflecting member 25 is provided so as to face the common window member 23. The reflective member 25 is sealed and fixed by a sealing member 29b. The light reflected by the reflective member 25 returns to the measurement hole and is incident on the collimator 50 through the common window member 23. Then, it is transmitted to the photodetector of the electric unit via the optical fiber 31. Also in the present embodiment, the gas concentration can be calculated on the basis of the output of the photodetector. In addition, the optical path length L in the present embodiment is determined as twice the distance between the common window member 23 and the reflecting member 25 in the vertical direction.

In the present embodiment, since the main flow path L1 is not used as the optical path, it is not necessary to provide optical system at both ends of the main flow path L1. Therefore, as shown in FIGS. 8(a) and 8(b), the main flow path L1 is formed not by a through hole, but by sealing a long hole extending to the innermost sub-flow path L2 with a sealing member 54. In another embodiment, a coupling member may be provided instead of the sealing member 54, and the coupling member may be used as a gas outlet to flow a gas downstream.

Embodiment 5

Figure 9:
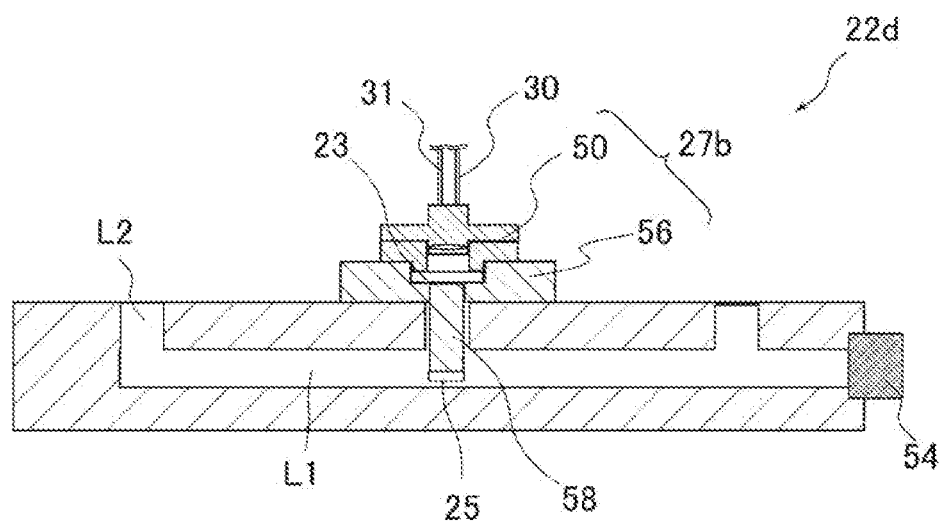
FIG. 9 shows a gas unit of the concentration measurement device in Embodiment 5, where 9(a) is a cross-sectional view when viewed from a side, 9(b) is a cross-sectional view when viewed from an end face direction.
Figure 9:
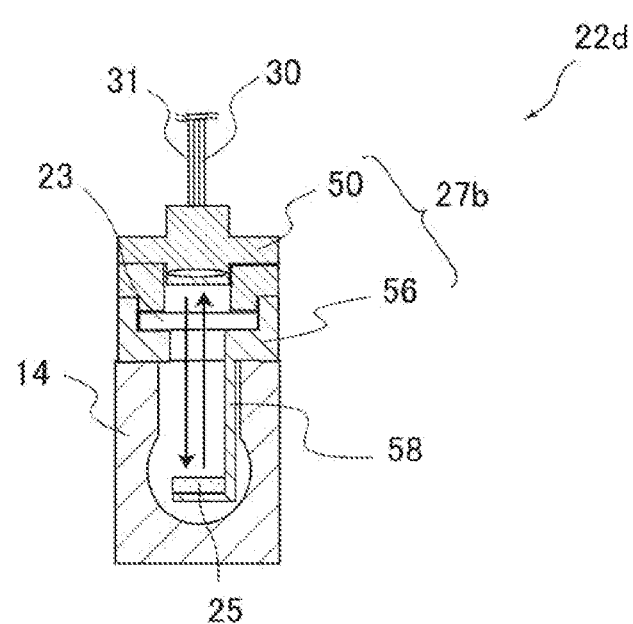

FIGS. 9(a) and 9(b) are a cross-sectional view from the side and a cross-sectional view from the end surface showing the gas unit 22d included in the concentration measurement device of Embodiment 5. The gas unit 22d of the present embodiment is also configured by utilizing the junction block 14 fixed to the integrated unit. Hereinafter, constituent elements same as those of Embodiments 3 and 4 are denoted by the same reference numerals, and detailed description thereof may be omitted.

As shown in FIGS. 9(a) and 9(b), the gas unit 22d constitutes a reflection type concentration measurement device that reciprocates light along the direction of the sub-flow path L2, as same as Embodiment 4. However, rather than sealing and fixing the reflecting member on the lower surface side of the junction block 14 as in Embodiment 4, a support member 58 connected to the sealing member 27b of the common window member 23 provided on the upper surface of the junction block 14 is used to support the reflective member 25.

In the gas unit 22d, the sealing member 27b includes a collimator 50, and a window receiving member 56. The support member 58 extends from the window receiving member 56, in a state of attaching the reflecting member 25, can be inserted from above along the measurement hole.

According to the above configuration, without performing particular processing to the junction block 14, it is possible to provide the reflecting member 25 below the flow path from above the junction block 14, by utilizing one of the sub-flow paths L2. In the present embodiment, convenience is highly improved because it can be integrated including the reflecting member 25, in addition to the collimator 50 and the common window member 23.

It is preferable that the support member 58 has a length reaching the main flow path L1 in order to satisfactorily perform the gas concentration measurement. The support member 58 is not limited to the plate-shape as shown in the drawings, it may be obtained by cutting one side surface in a cylindrical shape or may be configured of two bar members. The support member 58 may have any form as long as it does not traverse the optical path of the measurement light and does not hinder the gas from reaching the optical path.

Although the concentration measurement devices according to Embodiments 1 to 5 have been described above, any of the concentration measurement devices can be compactly incorporated into the gas supply system by using the junction block and can appropriately measure the concentration of various gases flowing through the junction block. It should be noted that the present invention is not construed as being limited to the above-mentioned embodiments, and various modifications are possible without departing from the spirit of the present invention.

INDUSTRIAL APPLICABILITY

The concentration measurement devices according to the embodiments of the present invention are suitably utilized for measuring the concentration of a gas by being incorporated into a gas supply system.

REFERENCE SIGNS LIST

1 Gas supply system
3 Gas supply source
5 Supply line
7 Process chamber
9 Vacuum pump
10 Integrated unit
12 Flow rate controller
14 Junction block
16 Base plate
20 Concentration measurement device
22 Gas unit
23 Common window member
24 Electrical unit
25 Reflecting member
26 Incident window
27 Sealing member
28 Emitting window
29 Sealing member
30, 31 Optical fiber
32, 33 Wire cable
40 Light source
44 Photodetector
46 Arithmetic control
48 Reference photodetector

What is claimed is:

1. A concentration measurement device configured to measure a concentration of a gas flowing through a junction block connected to a plurality of gas supply lines, comprising:
  a light source for generating light incident to a flow path formed in the junction block;
  a photodetector for receiving light emitted from the flow path; and
  an arithmetic control circuit for calculating the concentration of the gas flowing through the flow path based on an output of the photodetector, wherein at least one of a translucent incident window for making light from the light source incident to the flow path and a translucent emitting window for emitting light passing through the flow path is sealed and fixed to the junction block, wherein the junction block is an outlet side flow path block fixed on a base plate of an integrated unit in which the plurality of gas supply lines are formed on the base plate, wherein the junction block includes a plurality of sub-flow paths respectively connected to the plurality of gas supply lines; and a main flow path connected to the plurality of sub-flow paths, and wherein the main flow path is formed by a through hole extending along a longitudinal direction of the junction block, and each of the plurality of sub-flow paths is formed by a hole extending in a direction intersecting with the main flow path and provided so as to reach the main flow path from a surface of the junction block.

2. The concentration measurement device according to claim 1, wherein the incident window and the emitting window are sealed and fixed to both ends of the main flow path.

3. The concentration measurement device according to claim 2, wherein the incident window is sealed and fixed to the junction block by a first seal having a collimator, the light source and the first seal are connected by a first optical transmission line, the emitting window is sealed and fixed to the junction block by a second seal, and the photodetector and the second seal are connected to each other by a second optical transmission line.

4. The concentration measurement device according to claim 2, wherein the incident window is sealed and fixed to the junction block by a first seal having the light source and a collimator, the emitting window is sealed and fixed to the junction block by a second seal having the photodetector.

5. The concentration measurement device according to claim 1, wherein the incident window is a common window that also serves as the emitting window;

the common window is sealed and fixed to one end of the main flow path, and a reflector for reflecting light incident to the flow path is fixed to the main flow path.

6. The concentration measurement device according to claim 5, wherein a first optical transmission line for connecting the common window and the light source, and a second optical transmission line for connecting the common window and the photodetector are provided separately.

7. The concentration measurement device according to claim 1, wherein the incident window is a common window that also serves as the emitting window; the common window is fixed so as to seal a measurement hole portion; and a reflector for reflecting the light incident to the measurement hole portion is provided to face the common window.

8. The concentration measurement device according to claim 7, further comprising a supporter connected to a seal for sealing and fixing the common window, wherein the supporter extends along the measurement hole portion to support the reflector.

* * * * *